US009218882B2

(12) United States Patent
Fukuda

(10) Patent No.: US 9,218,882 B2
(45) Date of Patent: Dec. 22, 2015

(54) NONVOLATILE SEMICONDUCTOR MEMORY DEVICE

(71) Applicant: KABUSHIKI KAISHA TOSHIBA, Tokyo (JP)

(72) Inventor: Ryo Fukuda, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/475,490

(22) Filed: Sep. 2, 2014

(65) Prior Publication Data

US 2015/0262672 A1 Sep. 17, 2015

(30) Foreign Application Priority Data

Mar. 12, 2014 (JP) .................... 2014-049346

(51) Int. Cl.
*G11C 16/04* (2006.01)
*G11C 16/14* (2006.01)
*G11C 16/26* (2006.01)

(52) U.S. Cl.
CPC ........ *G11C 16/0483* (2013.01); *G11C 16/0466* (2013.01); *G11C 16/14* (2013.01); *G11C 16/26* (2013.01)

(58) Field of Classification Search
CPC .................................. G11C 16/0483
USPC .................................. 365/185.17
See application file for complete search history.

(56) References Cited

U.S. PATENT DOCUMENTS 8,797,806 B2 * 8/2014 Goda et al. ............ 365/185.26
8,836,007 B2 * 9/2014 Matsumoto et al. ........ 257/314
9,019,763 B2 * 4/2015 Fujiki et al. ............ 365/185.05
2012/0043599 A1 2/2012 Katsumata et al.
2012/0320697 A1 12/2012 Nagadomi

FOREIGN PATENT DOCUMENTS

JP 2012044031 A 3/2012
JP 2013004128 A 1/2013
JP 2013161803 A 8/2013
JP 2013201396 A 10/2013

OTHER PUBLICATIONS

Tanaka et al., "Bit Cost Scalable Technology with Punch and Plug Process for Ultra High Density Flash Memory," 2007 Symposium on VLSI Technology Digest of Technical Papers, 2007, pp. 14-15.
Maeda et al., "Multi-stacked 1G cell/layer Pipe-shaped BiCS Flash Memory," 2009 Symposium on VLSI Circuits Digest of Technical Papers, 2009, pp. 22-23.

* cited by examiner

*Primary Examiner* — Son Mai
(74) *Attorney, Agent, or Firm* — Patterson & Sheridan, LLP

(57) ABSTRACT

A nonvolatile semiconductor memory device includes a first memory string including memory cell transistors and a first select transistor that are connected in series, a second memory string including memory cell transistors and a second select transistor that are connected in series, a bit line that is electrically connected to a first end of the first memory string and a first end of the second memory string, a first transistor having a gate that is connected to a second end of the first memory string, a source line that is electrically connected to a first end of the first transistor, and a second transistor having a gate that is connected to a second end of the second memory string, a first end that is electrically connected to a second end of the first transistor, and a second end that is electrically connected to the bit line.

20 Claims, 14 Drawing Sheets

NONVOLATILE SEMICONDUCTOR MEMORY DEVICE

CROSS-REFERENCE TO RELATED APPLICATION

This application is based upon and claims the benefit of priority from Japanese Patent Application No. 2014-049346, filed Mar. 12, 2014, the entire contents of which are incorporated herein by reference.

FIELD

Embodiments described herein relate generally to a nonvolatile semiconductor memory device.

BACKGROUND

As a NAND-type flash memory, a three-dimensional stacked memory (Bit Cost Scalable (BiCS)) formed by vertically stacking layers and processing each layer is suggested. The three-dimensional stacked memory may include an I-shaped BiCS memory in which memory strings are formed along I-shaped memory holes, and a U-shaped BiCS (p-BiCS) memory in which memory strings are formed along U-shaped memory holes.

DETAILED DESCRIPTION

Figure 1:
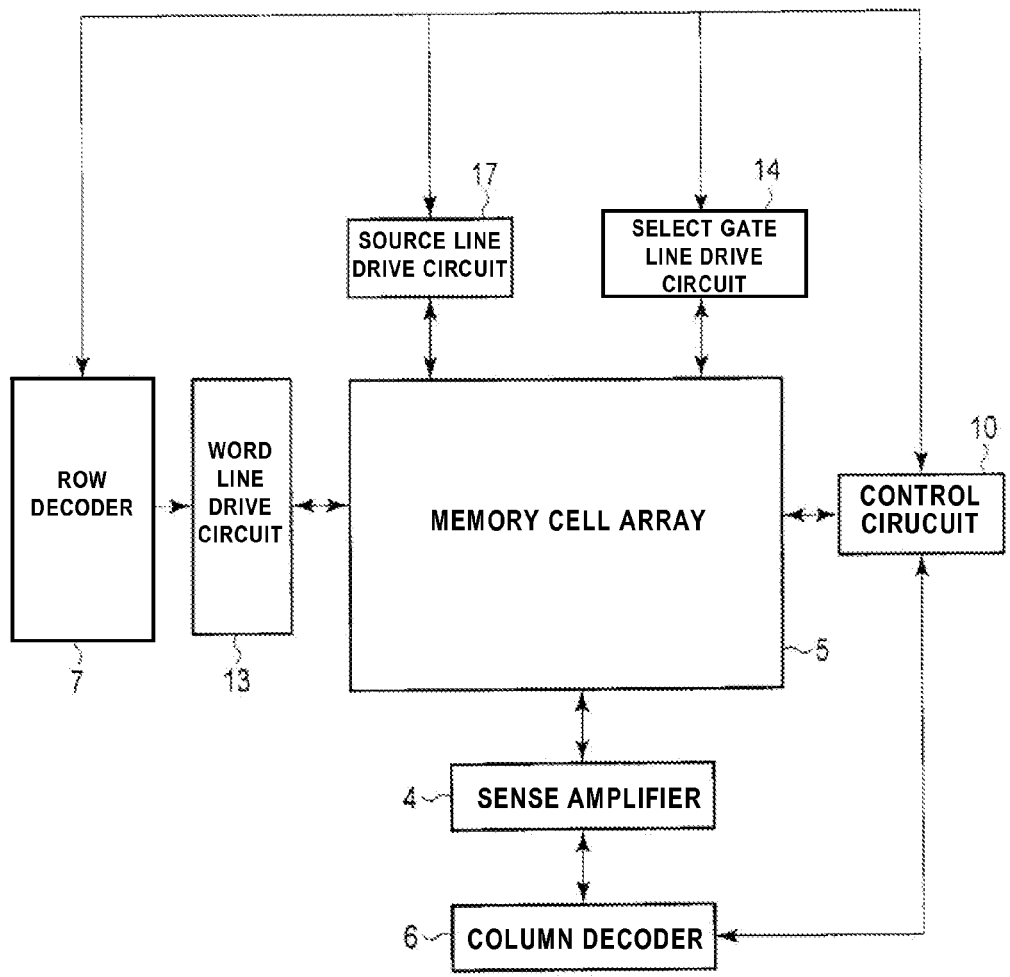
FIG. 1 is a block diagram illustrating an example of the overall configuration of a nonvolatile semiconductor memory device according to an embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A nonvolatile semiconductor memory device which achieves improvement in manufacturing and operation controllability is provided.

In general, according to one embodiment, a nonvolatile semiconductor memory device includes a first memory string including a plurality of first memory cell transistors and a first select transistor that are connected in series, a second memory string including a plurality of second memory cell transistors and a second select transistor that are connected in series, a bit line that is electrically connected to a first end of the first memory string and a first end of the second memory string, a first transistor having a gate that is connected to a second end of the first memory string; a source line that is electrically connected to a first end of the first transistor, and a second transistor having a gate that is connected to a second end of the second memory string, a first end that is electrically connected to a second end of the first transistor, and a second end that is electrically connected to the bit line.

An embodiment will now be described with reference to the drawings. In the drawings, like elements are denoted by like reference numerals. In addition, repeated descriptions will be provided as necessary.

(Embodiment)

A nonvolatile semiconductor memory device according to this embodiment will be described with reference to FIGS. 1 to 14. In this embodiment, in an I-shaped BiCS memory, a plurality of connection transistors CT include insulating layers 50 formed at the bottom surfaces of memory holes MH, semiconductor pillars SP, and a semiconductor substrate 20. In this configuration, various operations may be performed, thereby achieving a nonvolatile semiconductor memory device which achieves improvement in manufacturing and operation controllability. Hereinafter, the nonvolatile semiconductor memory device according to this embodiment will be described in detail.

Configuration Example

Hereinafter, a configuration example of the nonvolatile semiconductor memory device according to this embodiment will be described with reference to FIGS. 1 to 4. In the following description, when component elements are not particularly distinguished, the elements are simply referred to as bit lines BL, source lines SL, select gates SG, control gates CG, memory cell transistors MT, select transistors ST, connection transistors CT, and memory strings 100.

As illustrated in FIG. 1, the nonvolatile semiconductor memory device includes a control circuit 10, a sense amplifier 4, a memory cell array 5, a column decoder 6, a row decoder 7, a word line drive circuit 13, a select gate line drive circuit 14, and a source line drive circuit 17.

The memory cell array 5 includes a plurality of word lines, a plurality of select gates SG, a plurality of source lines SL, a plurality of bit lines BL, and a plurality of memory strings (e.g., NAND strings) 100 arranged in a matrix form.

The control circuit 10 generates and controls a voltage supplied to the memory cells in the memory cell array 5 during a write operation, a read operation, and an erase operation, and according to commands from the outside, controls the sense amplifier 4, the column decoder 6, the row decoder 7, the select gate line drive circuit 14, and the source line drive circuit 17.

The column decoder 6 selects the bit lines BL during the write operation, the read operation, and the erase operation according to the control of the control circuit 10.

The sense amplifier 4 is connected to the column decoder 6 and supplies voltages to the bit lines BL that are selected and are not selected by the column decoder 6 during the write operation, the read operation, and the erase operation. In addition, the sense amplifier 4 may be integrated with the column decoder 6.

The row decoder 7 selects the control gates CG during the write operation, the read operation, and the erase operation according to the control of the control circuit 10.

The word line drive circuit 13 is connected to the row decoder 7 and supplies voltages to the control gates CG that are selected and are not selected by the row decoder 7 during the write operation, the read operation, and the erase operation. In addition, the word line drive circuit 13 may be integrated with the row decoder 7.

The select gate line drive circuit 14 supplies voltages to the select gates SG during the write operation, the read operation, and the erase operation according to the control of the control circuit 10.

The source line drive circuit 17 supplies voltages to the source lines SL during the write operation, the read operation, and the erase operation according to the control of the control circuit 10.

Figure 2:
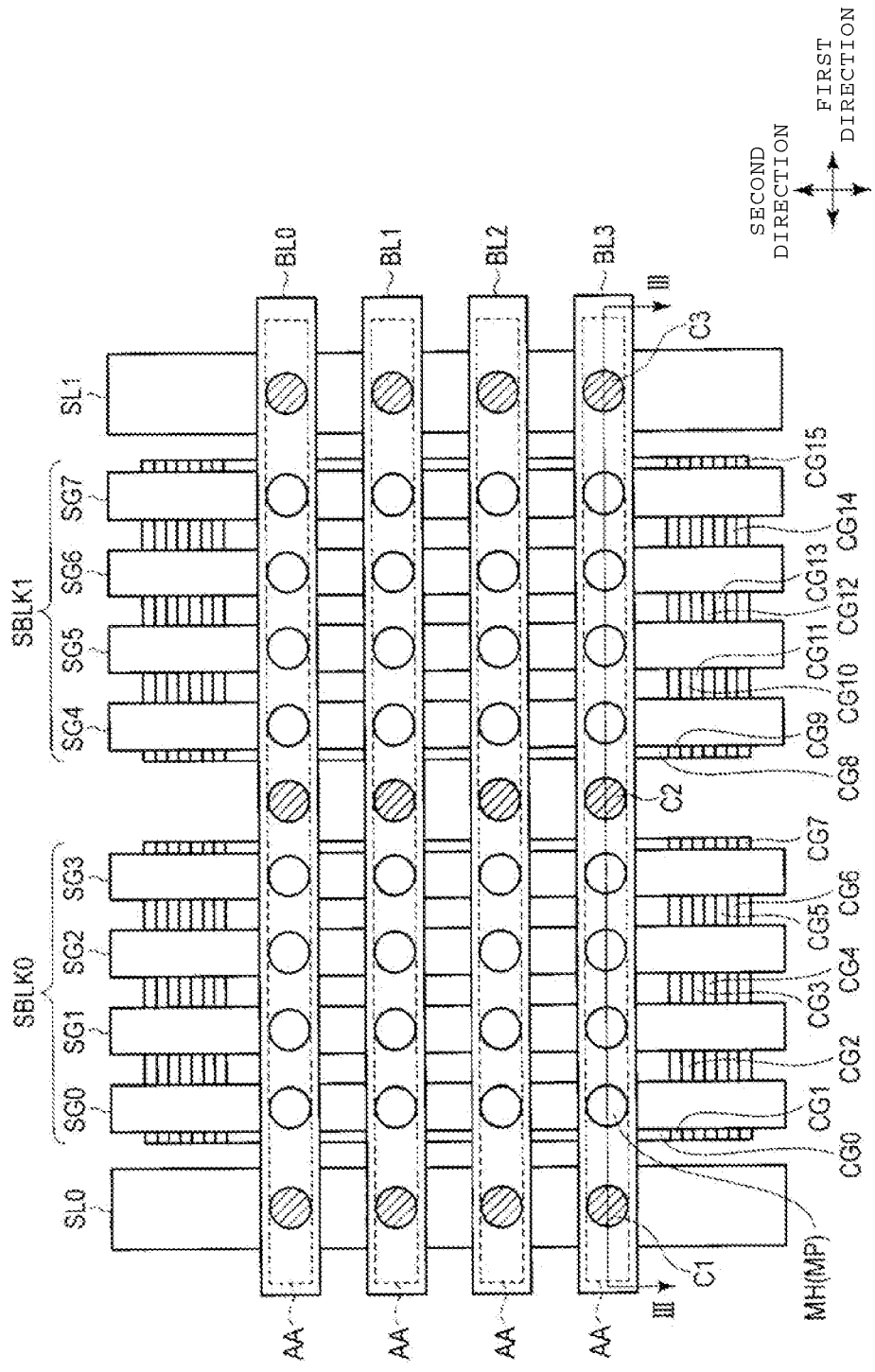
FIG. 2 is a plan view illustrating the configuration of a memory cell array according to the embodiment.
Figure 3:
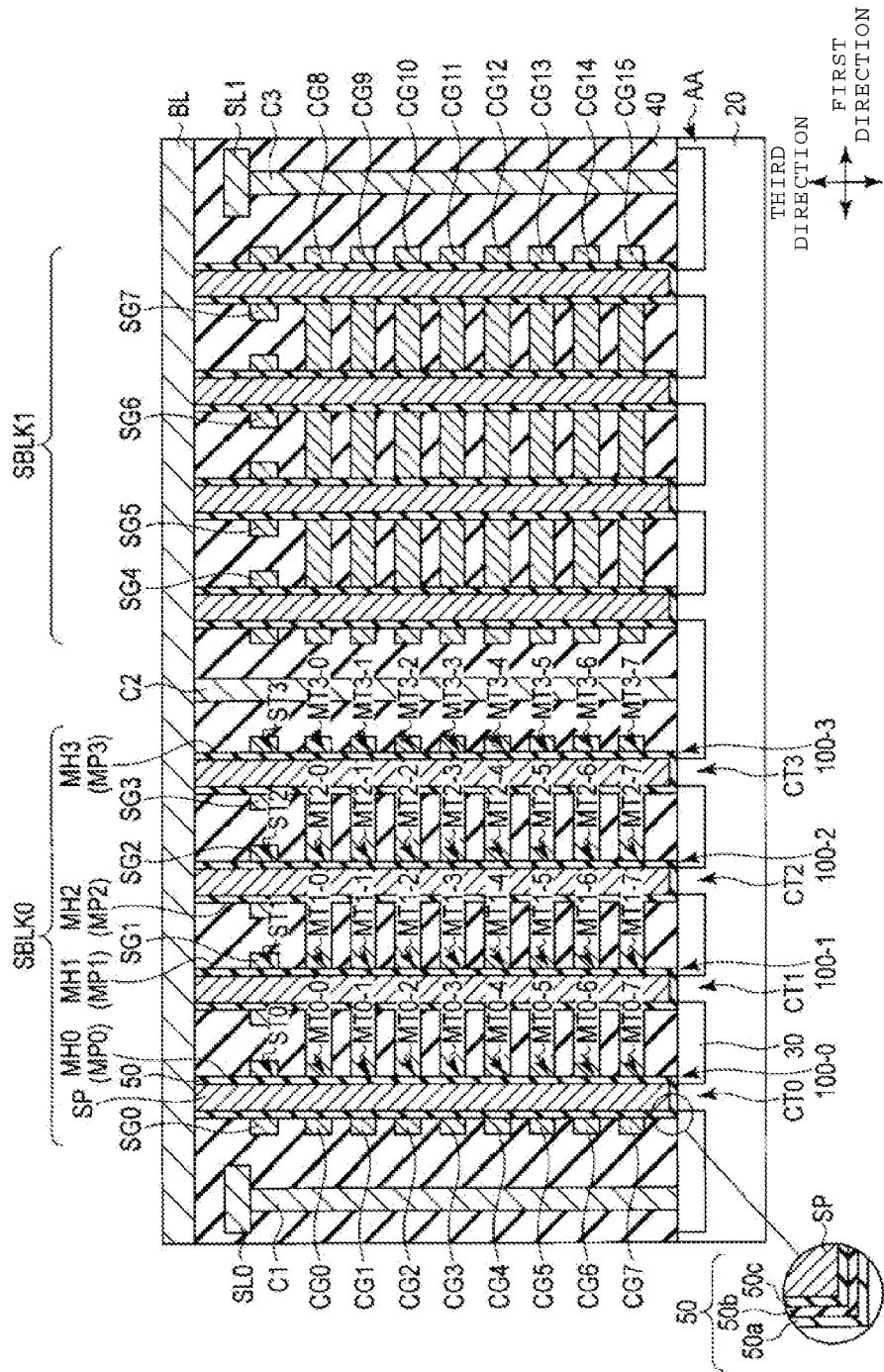
FIG. 3 is a cross-sectional view illustrating the configuration of the memory cell array according to the embodiment and is a cross-sectional view taken along line III-III of FIG. 2.

FIGS. 2 and 3 illustrate subblocks SBLK0 and SBLK1 which are adjacent to each other.

As illustrated in FIG. 2, in the subblock SBLK0, bit lines BL0 to BL3, select gates SG0 to SG3, and control gates CG0 to CG7 are arranged.

The bit lines BL0 to BL3 are arranged to extend in a first direction on a plane and to be adjacent to one another at intervals therebetween in a second direction (direction perpendicular to the first direction) on the plane. The bit lines BL0 to BL3 are shared by the memory cell transistors MT in the adjacent subblocks SBLK0 and SBLK1.

The select gates SG0 to SG3 extend in the second direction and are adjacent to one another at intervals therebetween in the first direction. The select gates SG0 to SG3 are formed below the bit lines BL0 to BL3.

The control gates CG0 to CG7 are stacked in a third direction (stacking direction (vertical direction with respect to the substrate)). The control gates CG0 to CG7 are formed below the select gates SG0 to SG3. The control gates CG0 to CG7 are respectively formed in the layers of the subblock SBLK0.

The memory holes MH, in which memory pillars MP are formed, are formed to penetrate through the select gates SG0 to SG3 and the control gates CG0 to CG7. The memory strings 100 are formed along the memory pillars MP and are arranged in a matrix form. Active areas AA are formed to respectively correspond to the bit lines BL0 to BL3.

In the subblock SBLK1, the bit lines BL0 to BL3, select gates SG4 to SG7, and control gates CG8 to CG15 are arranged. Since the configuration of the subblock SBLK1 is the same as that of the subblock SBLK0, description thereof will be omitted.

A source line SL0 extends in the second direction. The source line SL0 is adjacent to the subblock SBLK0 at an interval on the opposite side to the subblock SBLK1. A source line SL1 is adjacent to the subblock SBLK1 at an interval on the opposite side to the subblock SBLK0.

The source line SL0 is connected to the semiconductor substrate 20 via contacts C1, and the source line SL1 is connected to the semiconductor substrate 20 via contacts C3. The bit lines BL0 to BL3 are connected to the semiconductor substrate 20 via contacts C2 formed between the subblocks SBLK0 and SBLK1. In other words, the subblock SBLK0 is disposed between the contacts C1 and the contacts C2, and the subblock SBLK1 is disposed between the contacts C3 and the contacts C2.

As illustrated in FIG. 3, in the subblock SBLK0, the control gates CG0 to CG7, the select gates SG0 to SG3, the bit lines BL, and memory pillars MP0 to MP3 are formed on the semiconductor substrate 20.

The control gates CG0 to CG7 are stacked above the semiconductor substrate 20 via insulating layers 40 interposed therebetween. In other words, above the semiconductor substrate 20, the control gates CG0 to CG7 and the insulating layers 40 are alternately stacked.

The select gates SG0 to SG3 are formed above the control gate CG0 positioned at the uppermost layer via the insulating layer 40.

A memory hole MHO is provided in the select gate SG0, the control gates CG0 to CG7, and the insulating layers 40. The memory hole MHO is formed to penetrate through the select gate SG0, the control gates CG0 to CG7, and the insulating layers 40 in the third direction (the stacking direction) and to reach the semiconductor substrate 20.

The memory pillar MP0 is formed in the memory hole MHO. The memory pillar MP0 includes the insulating layer 50 and the semiconductor pillar SP. The insulating layer 50 is formed to be continuous (connected) on the inner surface (the bottom surface and the side surface) of the memory hole MHO. In other words, the insulating layer 50 is formed on the semiconductor substrate 20 in the memory hole MHO, the insulating layer 40, the control gates CG0 to CG7, and the select gate SG0. In addition, the insulating layer 50 includes a block insulating layer 50a, a charge storage layer 50b, and a tunnel insulating layer 50c which are formed on the inner surface of memory hole MHO in this order. The semiconductor pillar SP is formed on the insulating layer 50 in the memory hole MHO.

In the vicinity of the surface of the semiconductor substrate 20, source drain diffusion layers 30 are formed with the memory pillar MP0 interposed therebetween in the first direction.

The memory pillar MP0, the control gates CG0 to CG7, the select gate SG0, and the semiconductor substrate 20 form various types of transistors.

More specifically, the semiconductor pillar SP in the memory hole MHO, the insulating layer 50 formed on the side surface in the memory hole MHO, and the control gates CG0 to CG7 form memory cell transistors MT0_0 to MT0_7. At this time, the semiconductor pillar SP functions as a channel, the insulating layer 50 functions as a memory layer, and the control gates CG0 to CG7 function as gates.

In addition, the semiconductor pillar SP in the memory hole MHO, the insulating layer 50 formed on the side surface in the memory hole MHO, and the select gate SG0 form a select transistor ST0. At this time, the semiconductor pillar SP functions as a channel, the insulating layer 50 functions as a gate insulating layer, and the select gate SG0 functions as a gate.

The current paths of the memory cell transistors MT0_0 to MT0_7 and the select transistor ST0 are connected in series to configure a memory string 100_0.

Furthermore, the semiconductor pillar SP in the memory hole MHO, the insulating layer 50 formed on the bottom surface in the memory hole MHO, and the semiconductor substrate 20 form a connection transistor CT0. At this time, the vicinity of the surface of the semiconductor substrate 20 between the source drain diffusion layers 30 functions as a channel, the insulating layer 50 functions as a gate insulating layer, and the semiconductor pillar SP functions as a gate.

In the same manner, the memory pillar MP1 and the control gates CG0 to CG7 form memory transistors MT1_0 to MT1_7, the memory pillar MP1 and the select gate SG1 form a select transistor ST1, and the memory pillar MP1 and the semiconductor substrate 20 form a connection transistor CT1. In addition, the memory pillar MP2 and the control gates CG0 to CG7 form memory transistors MT2_0 to MT2_7, the memory pillar MP2 and the select gate SG2 form a select transistor ST2, and the memory pillar MP2 and the semiconductor substrate 20 form a connection transistor CT2. In addition, the memory pillar MP3 and the control gates CG0 to CG7 form memory transistors MT3_0 to MT3_7, the memory pillar MP3 and the select gate SG3 form a select transistor ST3, and the memory pillar MP3 and the semiconductor substrate 20 form a connection transistor CT3.

The current paths of the connection transistors CT0 to CT3 are connected in series and configure a series connection body. In addition, the two adjacent transistors among the connection transistors CT0 to CT3 share the source drain diffusion layer 30 positioned therebetween.

The bit line BL is formed in an Ml layer to come into contact with the upper end portions of the memory pillars MP0 to MP3. In addition, the contact C2 is formed in the insulating layer 40 on the drain of the connection transistor CT3, and the upper end portion of the contact C2 is connected to the bit line BL. That is, the drain of the connection transistor CT3 is electrically connected to the bit line BL via the contact C2.

The source line SL0 is formed in an M0 layer. In addition, the contact C1 is formed in the insulating layer 40 on the source of the connection transistor CT0, and the upper end portion of the contact C1 is connected to the source line SL0. That is, the source of the connection transistor CT0 is electrically connected to the source line SL0 via the contact C1.

The subblock SBLK1 has the same structure as described above, and thus description thereof will be omitted. The subblock SBLK1 shares the contact C2 with the subblock SBLK0. That is, the bit line BL is shared by the adjacent two subblocks SBLK1 and SBLK0.

Figure 4:
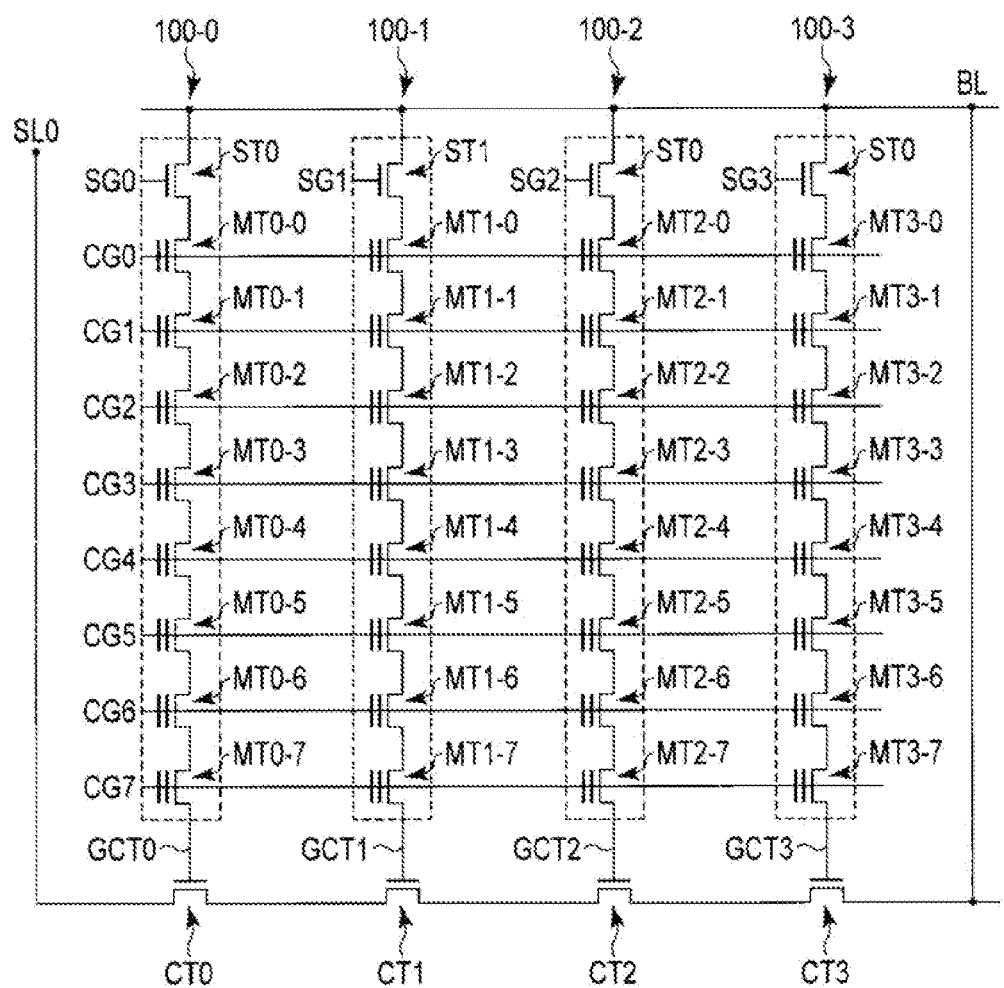
FIG. 4 is a circuit diagram illustrating the memory cell array according to the embodiment.

In FIG. 4, illustration of the subblock SBLK1 is omitted. As illustrated in FIG. 4, the memory cell array 5 includes memory strings 100_0 to 100_3 in the subblock SBLK0.

The memory string 100_0 includes the memory cell transistors MT0_0 to MT0_7 and the select transistor ST0 of which the current paths are connected in series. The memory string 100_1 includes the memory cell transistors MT1_0 to MT1_7 and the select transistor ST1, the current paths of which are connected in series. The memory string 100_2 includes the memory cell transistors MT2_0 to MT2_7 and the select transistor ST2, the current paths of which are connected in series. The memory string 100_3 includes the memory cell transistors MT3_0 to MT3_7 and the select transistor ST3, the current paths of which are connected in series.

The control gate CG0 is common to the gates of the memory cell transistors MT0_0 to MT3_0 so that the gates are electrically connected. The control gate CG1 is common to the gates of the memory cell transistors MT0_1 to MT3_1 so that the gates are electrically connected. The control gate CG2 is common to the gates of the memory cell transistors MT0_2 to MT3_2 so that the gates are electrically connected. The control gate CG3 is common to the gates of the memory cell transistors MT0_3 to MT3_3 so that the gates are electrically connected. The control gate CG4 is common to the gates of the memory cell transistors MT0_4 to MT3_4 so that the gates are electrically connected. The control gate CG5 is common to the gates of the memory cell transistors MT0_5 to MT3_5 so that the gates are electrically connected. The control gate CG6 is common to the gates of the memory cell transistors MT0_6 to MT3_6 so that the gates are electrically connected. The control gate CG7 is common to the gates of the memory cell transistors MT0_7 to MT3_7 so that the gates are electrically connected.

The gates of the select transistors ST0 to ST3 are electrically connected to the select gates SG0 to SG3, respectively.

The bit line BL is common to one ends of the memory strings 100_0 to 100_3 so that the one ends are electrically connected. The other end of the memory string 100_0 is electrically connected to a gate GCT0 of the connection transistor CT0. The other end of the memory string 100_1 is electrically connected to a gate GCT1 of the connection transistor CT1. The other end of the memory string 100_2 is electrically connected to a gate GCT2 of the connection transistor CT2. The other end of the memory string 100_3 is electrically connected to a gate GCT3 of the connection transistor CT3.

The current paths of the connection transistors CT0 to CT3 are connected in series and configure a series connection body. One end (source end) of the series connection body is electrically connected to the source line SL0, and the other end (drain end) thereof is electrically connected to the bit line BL.

The configuration of a memory cell array is described in, for example, U.S. patent Ser. No. 12/407,403 filed on Mar. 19, 2009, titled as a "three-dimensional stacked nonvolatile semiconductor memory", and is also described in U.S. patent Ser. No. 12/406,524 filed on Mar. 18, 2009, titled as a "three-dimensional stacked nonvolatile semiconductor memory". The entireties of the patent applications are incorporated in this disclosure by reference.

Example of Read Operation

An example of the read operation according to this embodiment will be described with reference to FIGS. 5 to 9.

Figure 6:
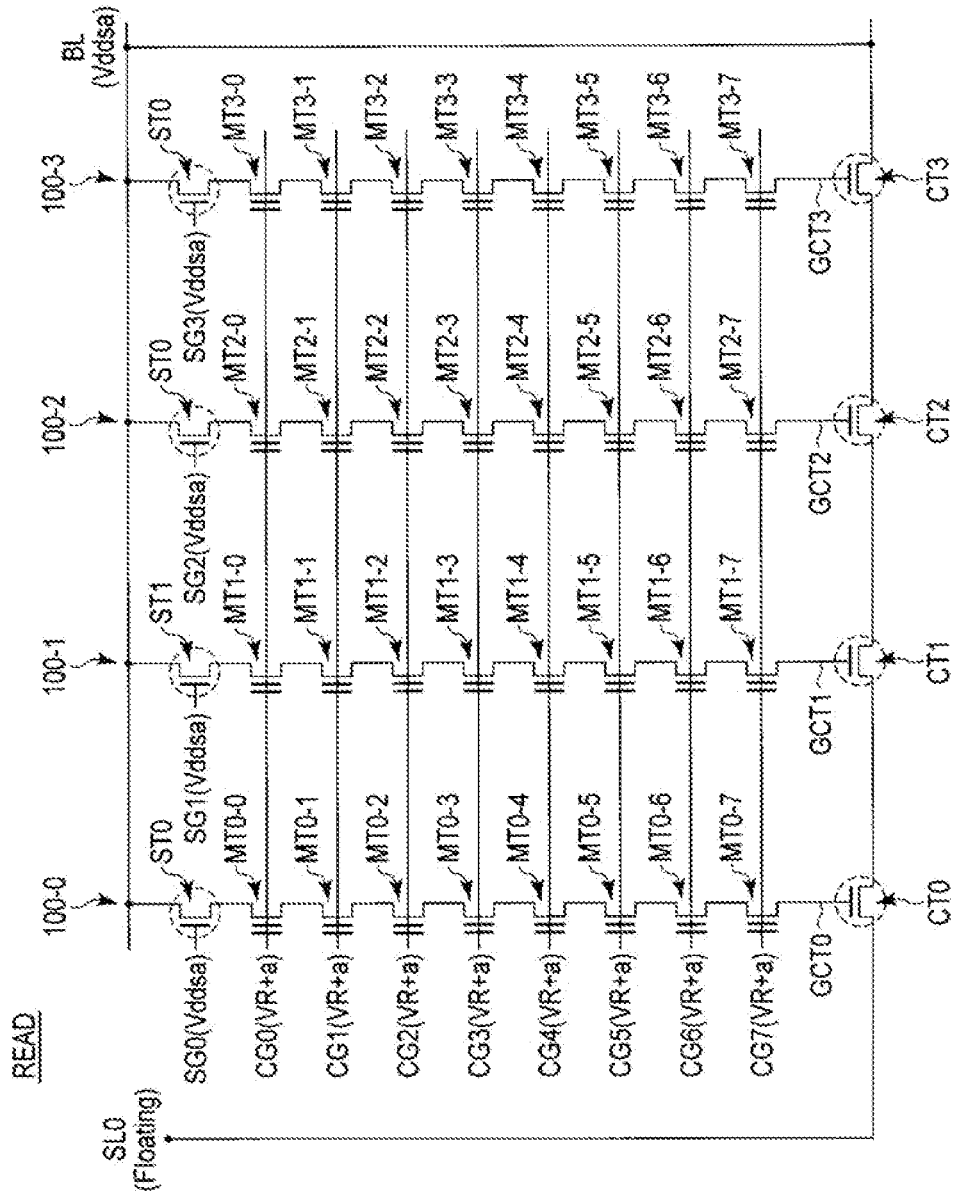
FIG. 6 is a circuit diagram illustrating the read operation according to the embodiment.
Figure 7:
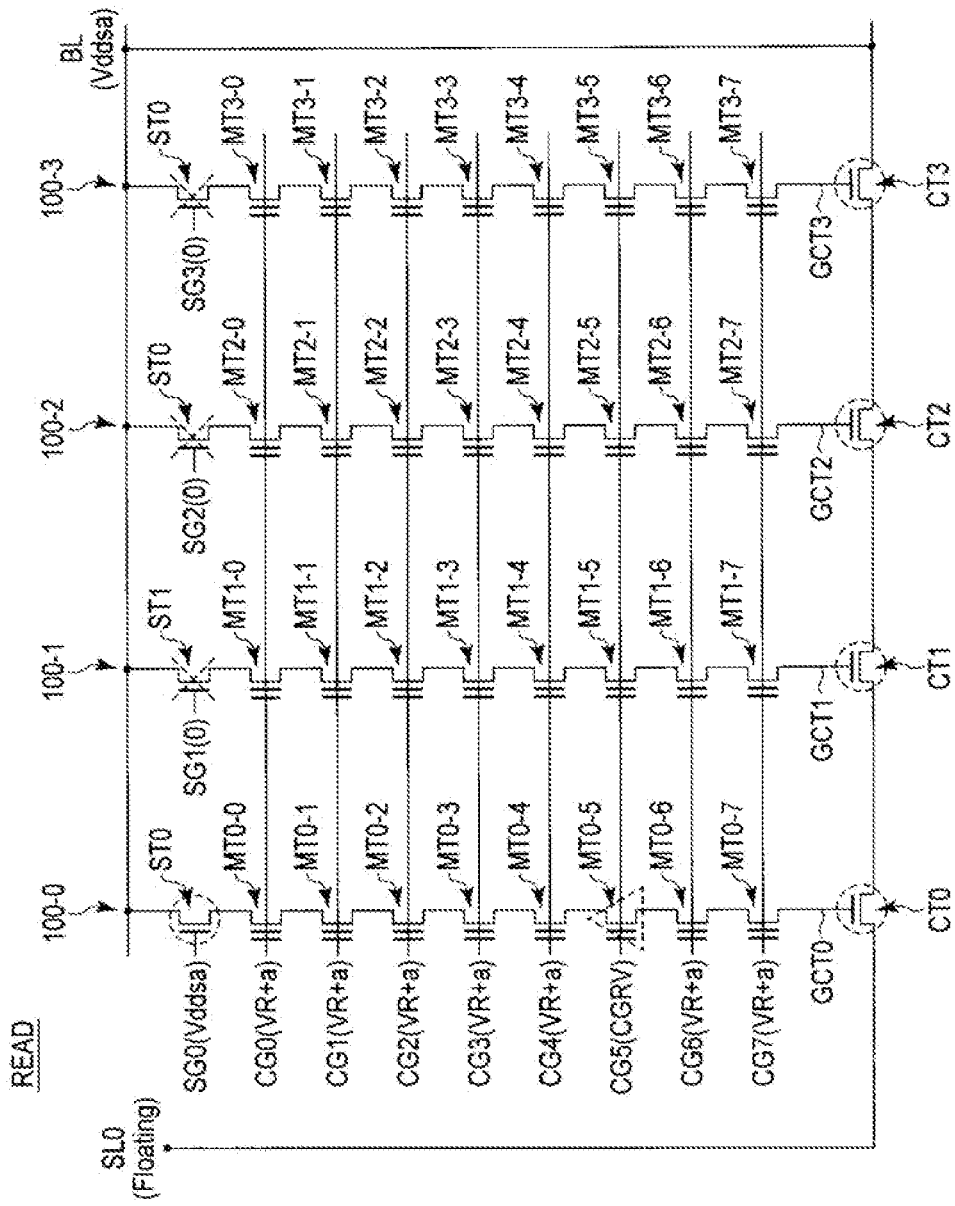
FIG. 7 is a circuit diagram illustrating the read operation according to the embodiment.
Figure 8:
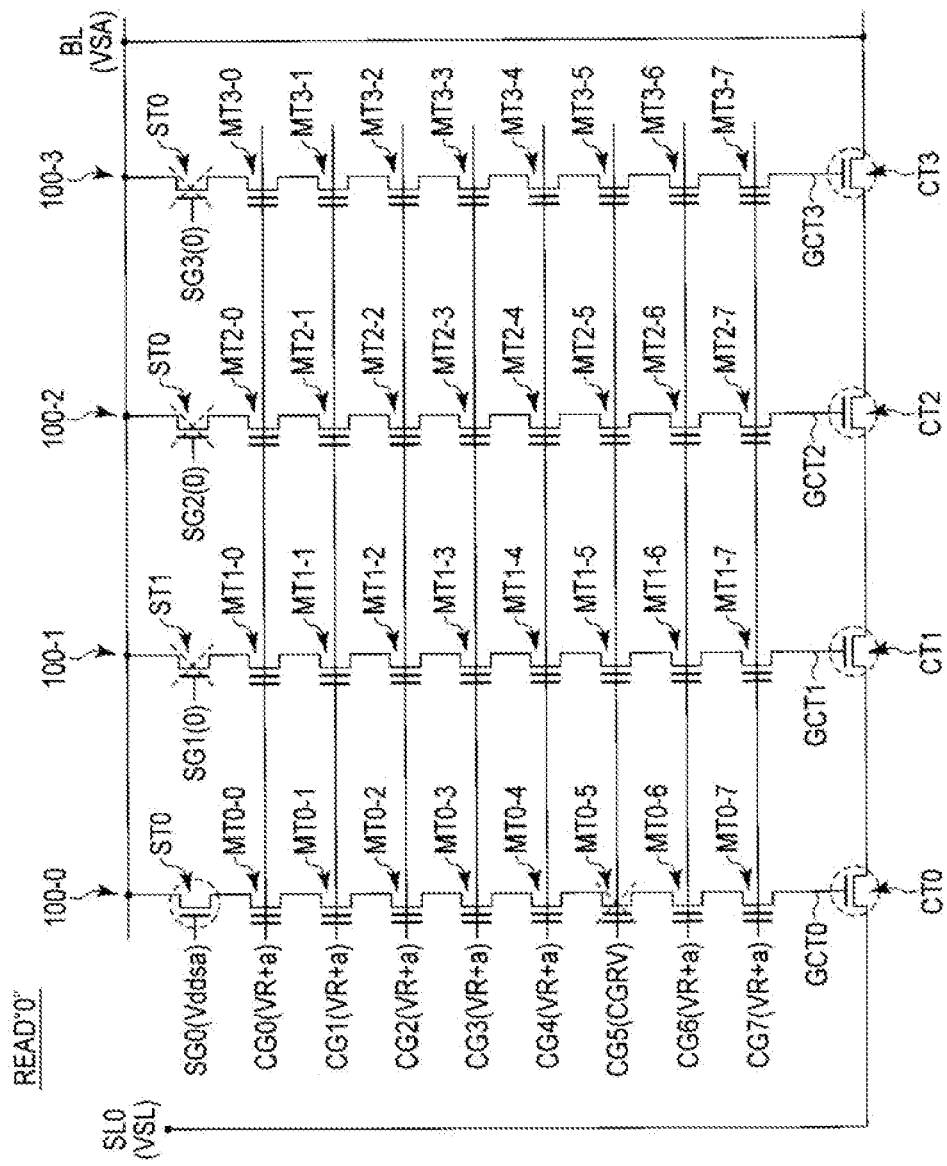
FIG. 8 is a circuit diagram illustrating the read operation according to the embodiment.
Figure 9:
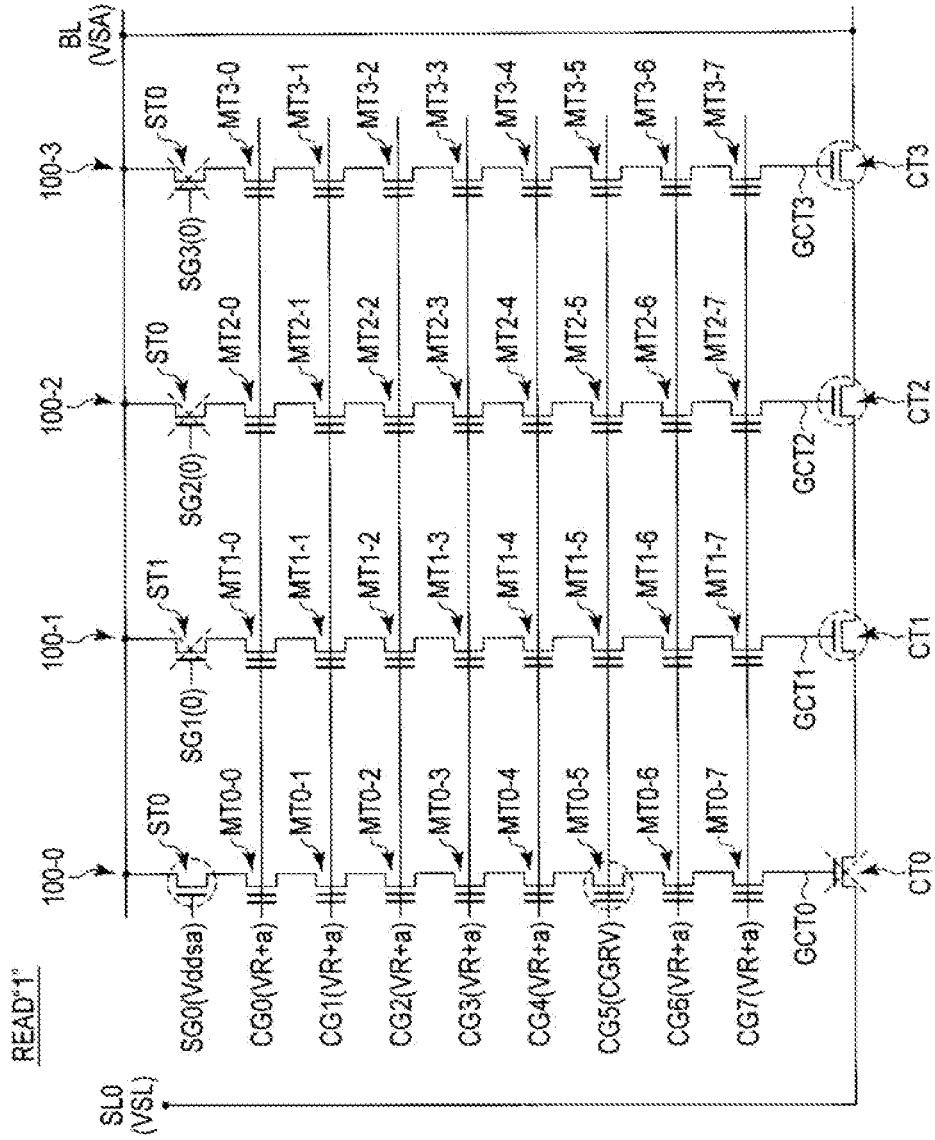
FIG. 9 is a circuit diagram illustrating the read operation according to the embodiment.

FIG. 6 is a diagram illustrating the read operation at times T1 to T2, FIG. 7 is a diagram illustrating the read operation at times T2 to T3, FIG. 8 is a diagram illustrating the read operation of "0" data at times T3 to T4, and FIG. 9 is a diagram illustrating the read operation of "1" data at times T3 to T4.

FIGS. 5 to 9 illustrate an example of reading data stored in the memory cell transistor MT0_5.

Figure 5:
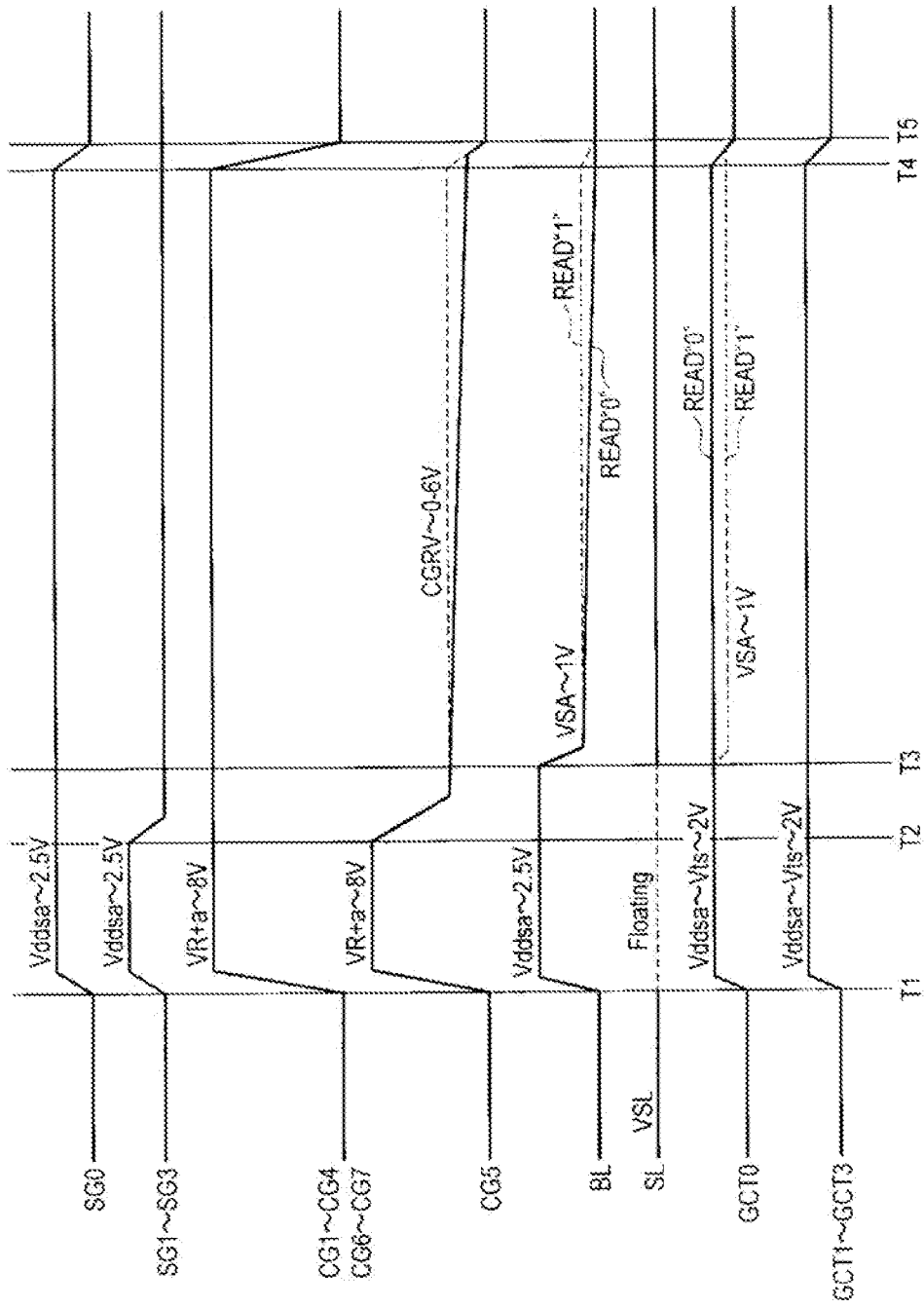
FIG. 5 is a diagram illustrating a timing chart of each voltage in a read operation according to the embodiment.

First, as illustrated in FIGS. 5 and 6, at the time T1, a voltage Vddsa is applied to the select gates SG0 to SG3 of the subblock SBLK0 which is selected. Accordingly, the select transistors ST0 to ST3 are turned on. The voltage Vddsa is a voltage at which the select transistors ST are sufficiently turned on. In addition, the voltage Vddsa is a voltage at which connection transistors CT are sufficiently turned on by a voltage Vddsa-Vts obtained by subtracting a threshold voltage Vts of the select transistors ST. The voltage Vddsa is, for example, about 2.5 V.

A voltage VR+a (read voltage) is applied to the control gates CG0 to CG7 of the subblock SBLK0 which is selected. Accordingly, the memory cell transistors MT0_0 to MT3_7 are turned on. The voltage VR+a is a voltage at which the memory cell transistors MT are sufficiently turned on and may sufficiently transmit the voltage Vddsa-Vts. That is, for the voltage VR+a, the margin of the threshold voltage Vtm of the memory cell transistors MT is sufficiently considered, and is, for example, about 8 V.

The voltage Vddsa is applied to the bit line BL. At this time, the select transistors ST0 to ST3 and the memory cell transistors MT0_0 to MT3_7 are turned on. Therefore, the voltage Vddsa-Vts which is obtained by subtracting the threshold voltage Vts of the select transistors ST is transmitted to the gates GCT0 to GCT3 of the connection transistors CT0 to CT3 via the select transistors ST0 to ST3 and the memory cell transistors MT0_0 to MT3_7 from the bit line BL. The voltage Vddsa-Vts is a voltage at which the connection transistors CT are sufficiently turned on and is, for example, about 2 V.

Accordingly, the connection transistors CT0 to CT3 are turned on. At this time, since the connection transistors CT0 to CT3 are turned on, the bit line BL and the source line SL0 are electrically connected to each other. In addition, by allowing the source line SL to float, a short circuit between the bit line BL and the source line SL may be avoided.

Although not shown in the figure, the select gates SG of a subblock SBLK which is not selected are set to 0 V to allow the control gates CG to float. Accordingly, the connection transistors CT of the subblock SBLK which is not selected are not turned on.

Thereafter, as illustrated in FIGS. 5 and 7, at the time T2, the select gates SG1 to SG3 in the memory strings 100_1 to 100_3 which are not selected are set to 0 V. Accordingly, the select transistors ST1 to ST3 are turned off. As a result, the gates GCT1 to GCT3 of the connection transistors CT1 to CT3 are disconnected from the bit line BL and remain at the voltage Vddsa-Vts applied thereto. That is, the connection transistors CT1 to CT3 are continuously turned on.

A read voltage CGRV is applied to the control gate CG5 connected to the memory cell transistor MT0_5 which is selected. The read voltage CGRV is a voltage at which the memory cell transistor MT0_5 which is selected is turned on or turned off depending on stored data (whether "0" data or "1" data). Here, turning on the memory cell transistor MT0_5 which is selected means that a voltage VSA, which will be described later, may be sufficiently transmitted, and turning off the memory cell transistor MT0_5 means that the voltage VSA cannot be transmitted. The read voltage CGRV may be set in detail in view of verification, and is, for example, about 0 to 6 V.

Thereafter, as illustrated in FIGS. 5, 8, and 9, at the time T3, the voltage VSA is applied to the bit line BL to allow the source line SL0 to be at a voltage VSL (for example, 0 V). The voltage VSA is a voltage at which the connection transistors CT are turned off, and is, for example, about 1 V.

At this time, as illustrated in FIG. 8, when the read voltage CGRV applied to the control gate CG5 is equal to or less than the sum (voltage Vtm+VSA) of the threshold voltage Vtm of the memory cell transistor MT0_5 and the voltage VSA, the memory cell transistor MT0_5 is turned off. In this case, the gate GCT0 of the connection transistor CT0 is maintained in the state of being electrically disconnected from the bit line BL. Therefore, the voltage Vddsa-Vts is applied to the gate GCT0, and thus the connection transistor CT0 is maintained in the ON state. Accordingly, the bit line BL and the source line SL0 are electrically connected to each other so that the voltage VSA of the bit line BL is drawn out (decreases) to the voltage VSL of the source line SL0. The sense amplifier 4 determines "0" data by sensing the voltage decrease of the bit line BL.

On the other hand, as illustrated in FIG. 9, when the read voltage CGRV applied to the control gate CG5 is equal to or higher than the sum (voltage Vtm+VSA) of the threshold voltage Vtm of the memory cell transistor MT0_5 and the voltage VSA, the memory cell transistor MT0_5 is turned on. In this case, the gate GCT0 of the connection transistor CT0 is electrically connected to the bit line BL. Therefore, the voltage VSA is applied to the gate GCT0, and thus the connection transistor CT0 is turned off. Accordingly, the bit line BL and the source line SL0 are electrically disconnected from each other and the bit line BL is maintained at the voltage VSA. The sense amplifier 4 determines "1" data by sensing the voltage VSA of the bit line BL.

As described above, when "0" data is stored, the threshold voltage Vtm of the memory cell transistor MT0_5 is higher than that when "1" data is stored. Therefore, by applying the read voltage CGRV to the gate of the memory cell transistor MT0_5, the memory cell transistor MT0_5 is turned on or turned off. Accordingly, the connection transistor CT0 is turned off or turned on, and by sensing the difference in the voltage of the bit line BL, "1" or "0" data may be determined.

In addition, when "0" data is read, as illustrated in FIG. 5, the voltage of the bit line BL decreases. Therefore, the source potential of the memory cell transistor MT0_5 which is electrically connected to the bit line BL also decreases. There may be a case where the memory cell transistor MT0_5 is turned on as the source potential decreases and thus the potential difference from the read voltage CGRV increases. Therefore, as illustrated in FIG. 5, according to the voltage decrease of the bit line BL, the read voltage CGRV may be controlled to decrease.

Write Operation

Hereinafter, an example of the write operation according to this embodiment will be described with reference to FIGS. 10 and 11.

Figure 10:
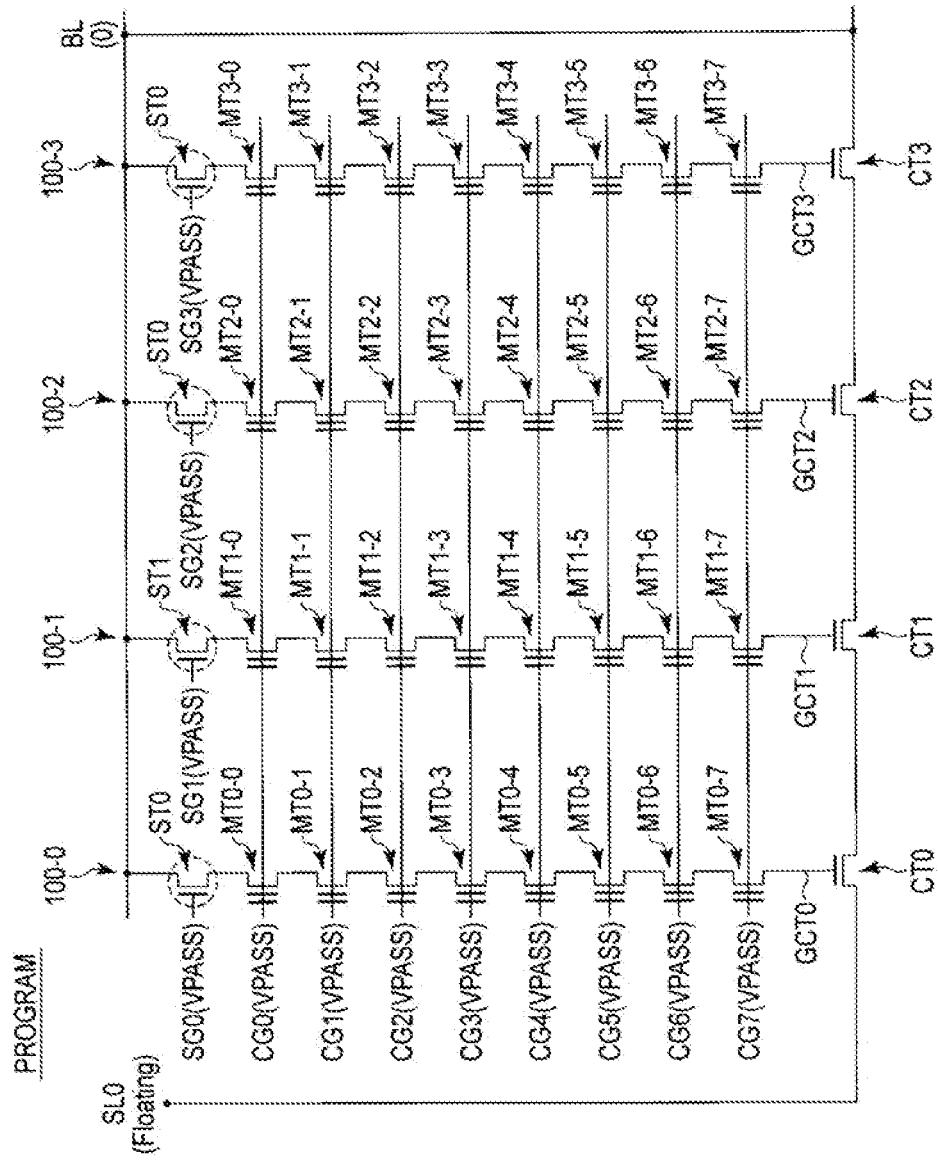
FIG. 10 is a circuit diagram illustrating a write operation according to the embodiment.
Figure 11:
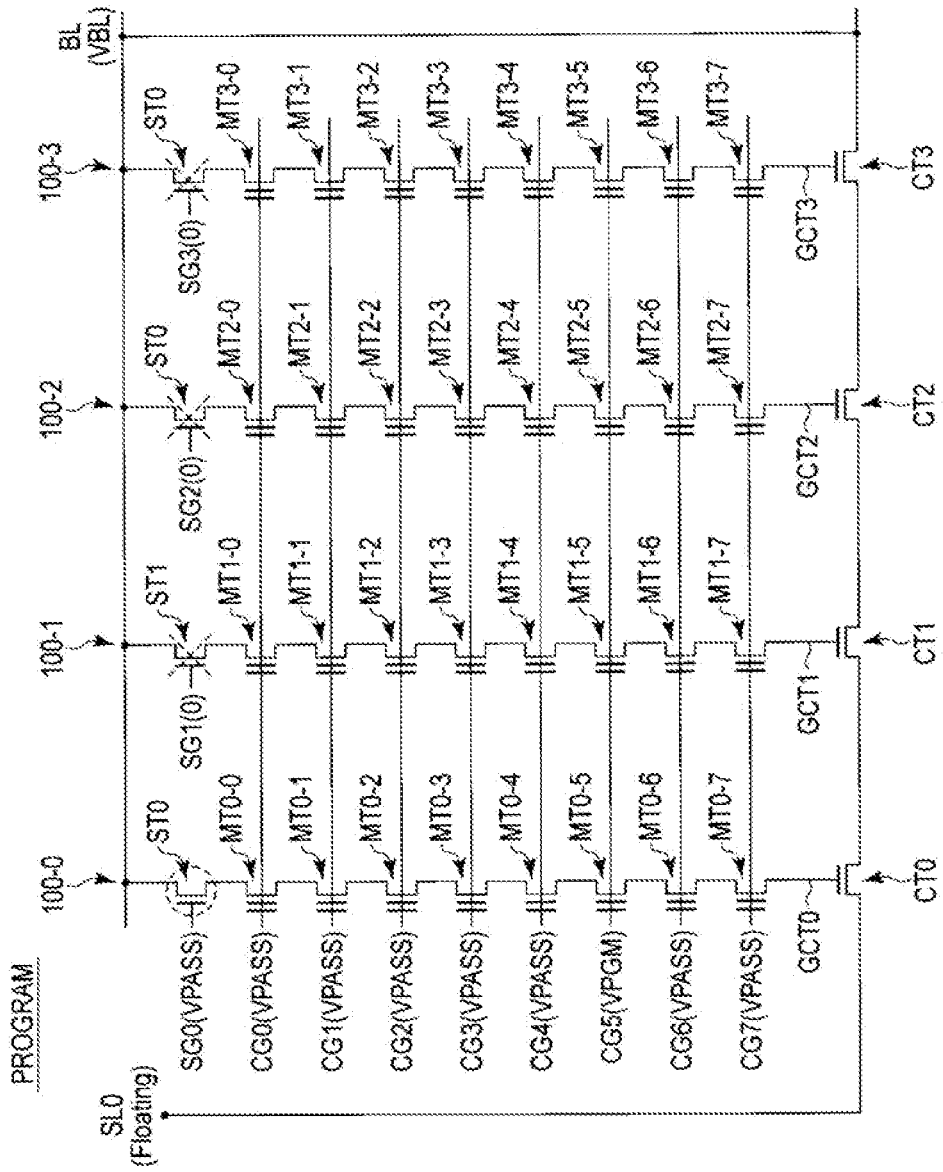
FIG. 11 is a circuit diagram illustrating a write operation according to the embodiment.

In FIGS. 10 and 11, an example of writing "0" data (data for increasing the threshold of a cell) on the memory cell transistor MT0_5 is illustrated.

First, as illustrated in FIG. 10, a voltage VPASS (write pass voltage) is applied to the select gates SG0 to SG3 and the control gates CG0 to CG7. Accordingly, the select transistors ST0 to ST3 and the memory cell transistors MT0_0 to MT3_7 are turned on. The voltage VPASS is a voltage at which the select transistors ST are sufficiently turned on and a voltage VBL, which will be described later, may be sufficiently transmitted.

In addition, the bit line BL is set to 0 V. At this time, the select transistors ST0 to ST3 and the memory cell transistors MT0_0 to MT3_7 are turned on. Therefore, 0 V is transmitted to the gates GCT0 to GCT3 of the connection transistors CT0 to CT3 via the select transistors ST0 to ST3 and the memory cell transistors MT0_0 to MT3_7 from the bit line BL.

Thereafter, as illustrated in FIG. 11, the select gates SG1 to SG3 are set to 0 V. Accordingly, the select transistors ST1 to ST3 are turned off. As a result, channel current does not flow through the current paths of the memory strings 100_1 to 100_3 so as to be in a floating state.

On the other hand, while the select gate SG0 is in the ON state, the voltage VBL (VBL>0 V) is applied to the bit line BL. Accordingly, channel current flows through the current paths of the memory strings 100_0. In addition, a write voltage VPGM (VPGM>VPASS) is applied to the control gate CG5 connected to the memory cell transistor MT0_5. As a result, a high electric field is applied to the memory cell transistor MT0_5, and data (here, "0" data) is written according to write data temporarily stored in the sense amplifier 4 connected to the bit line BL.

Erase Operation

Hereinafter, an example of the erase operation according to this embodiment will be described with reference to FIG. 12.

Figure 12:
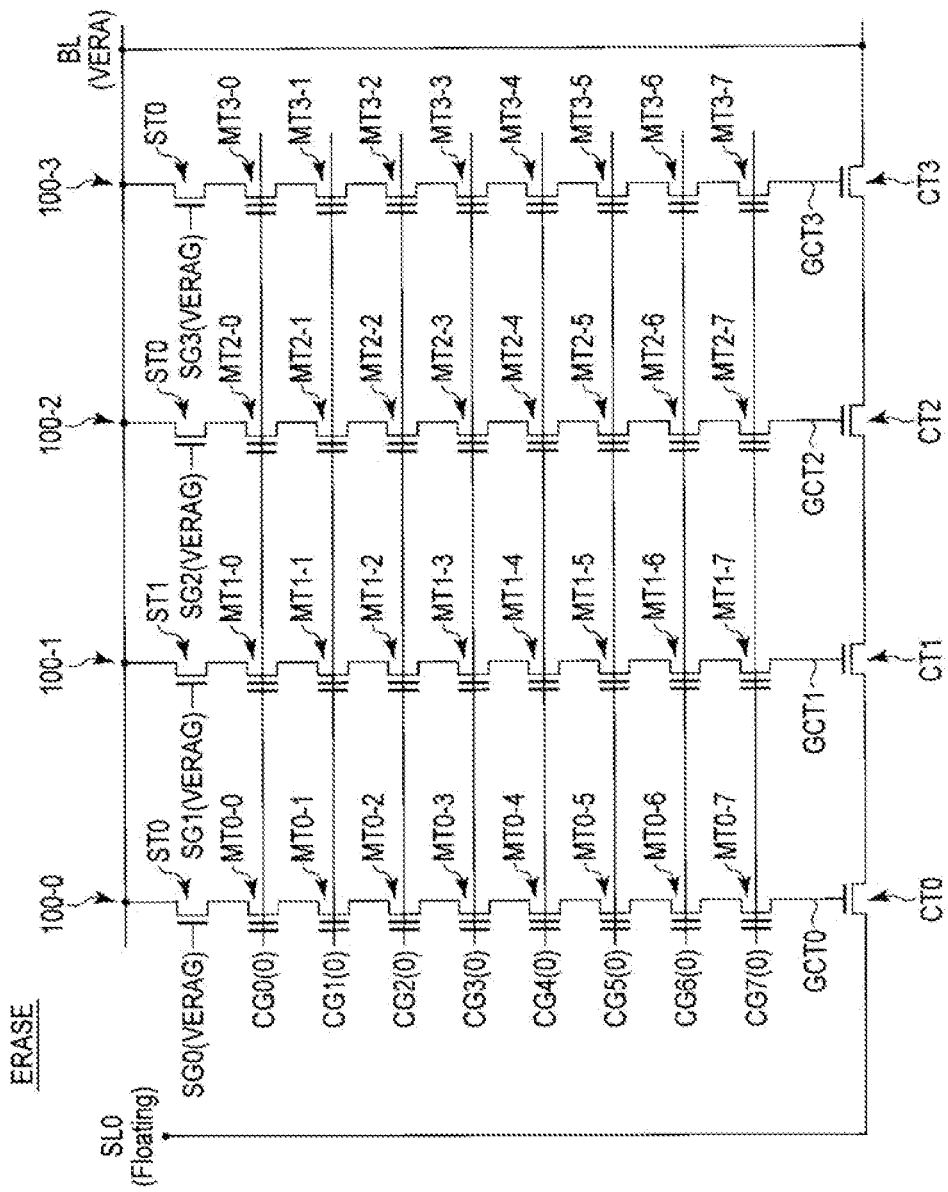
FIG. 12 is a circuit diagram illustrating an erase operation according to the embodiment.

As illustrated in FIG. 12, a voltage VERAG is applied to the select gates SG0 to SG3. In addition, a voltage VERA is applied to the bit line BL. That is, the voltage VERAG is applied to the gates of the select gates SG0 to SG3, and the voltage VERA is applied to the source ends of the select transistors ST0 to ST3. Here, VERA>VERAG is satisfied. By applying the voltage to the select gates SG0 to SG3, gate-induced drain leakage (GIDL) occurs in the source regions of the select transistors ST0 to ST3.

Hole current due to the GIDL flows through the current paths of the memory strings 100_0 to 100_3. At this time, the control gates CG0 to CG7 are set to 0 V. Accordingly, hole current may be introduced to the memory cell transistors MT0_0 to MT3_7, and data of the memory cell transistors MT0_0 to MT3_7 may be erased.

Effects According to First Embodiment

At the same number of stacked layers, the I-shaped memory has the following advantages compared to the U-shaped memory.

In the I-shaped memory, the number of cells from the bit line to the source line (the number of cells in a single memory string) is the half of that of the U-shaped memory. Accordingly, current that flows through the cells increases, resulting in high operation performance. In addition, in the U-shaped memory, adjacent control gates need to be separated from each other. As a result, the control gates have a comb shape. Therefore, the U-shaped memory has a larger area in the block boundary and the like than that of the I-shaped memory.

As described above, the I-shaped memory has advantages that the operation performance is high and the area efficiency is high compared to the U-shaped memory. However, in the I-shaped memory, there are problems in that controllability of the select gates at the lowermost layer is poor and it is not easy to remove the insulating layers formed at the bottom surfaces of the memory holes.

On the contrary, in this embodiment, in the I-shaped BiCS memory, the plurality of connection transistors CT include the insulating layers 50 formed at the bottom surfaces of memory holes MH, the semiconductor pillars SP, and the semiconductor substrate 20. In addition, the current paths of the plurality of connection transistors CT are connected in series and configure a series connection body in which one end is electrically connected to the source line SL and the other end is electrically connected to the bit line BL. In this configuration, various operations may be performed. Therefore, the select gates at the lowermost layer become unnecessary, and it is unnecessary to remove the insulating layers 50 formed at the bottom surfaces of the memory holes MH. That is, an I-shaped BiCS memory which s improved in manufacturing and operation controllability may be achieved.

Figure 13:
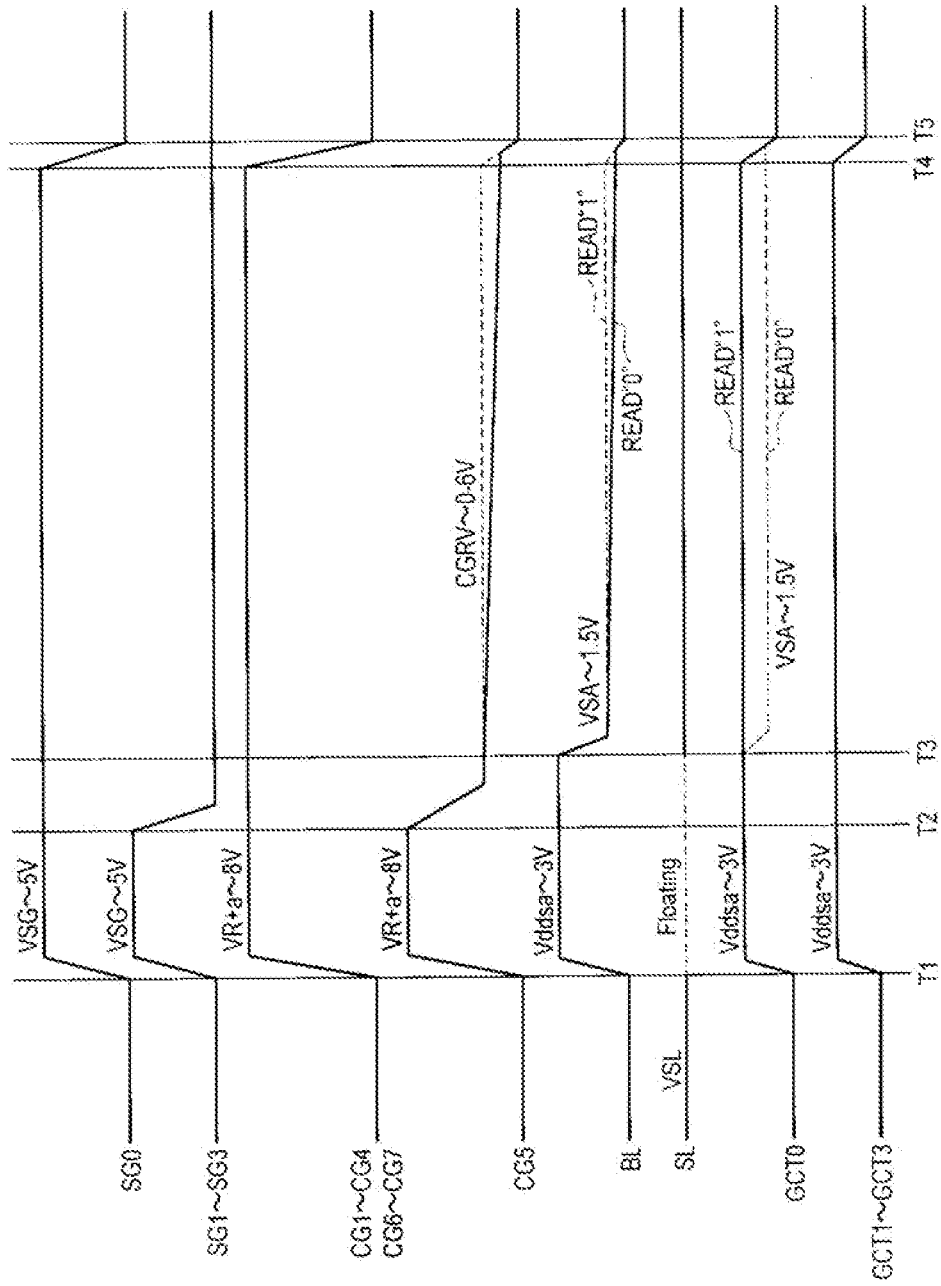
FIG. 13 is a diagram illustrating a modified example of the timing chart of each voltage in the read operation according to the embodiment.

In addition, as illustrated in FIG. 13, in the read operation, a voltage VSG (for example, about 5 V) which is higher than the voltage Vddsa may be applied to the select gates SG0 to SG3. Accordingly, the select transistors ST0 to ST3 may sufficiently transmit the voltage Vddsa. Therefore, the voltage Vddsa and the voltage VSA may be high voltages (the voltage Vddsa is, for example, 3 V, and the voltage VSA is, for example, 1.5 V).

Figure 14:
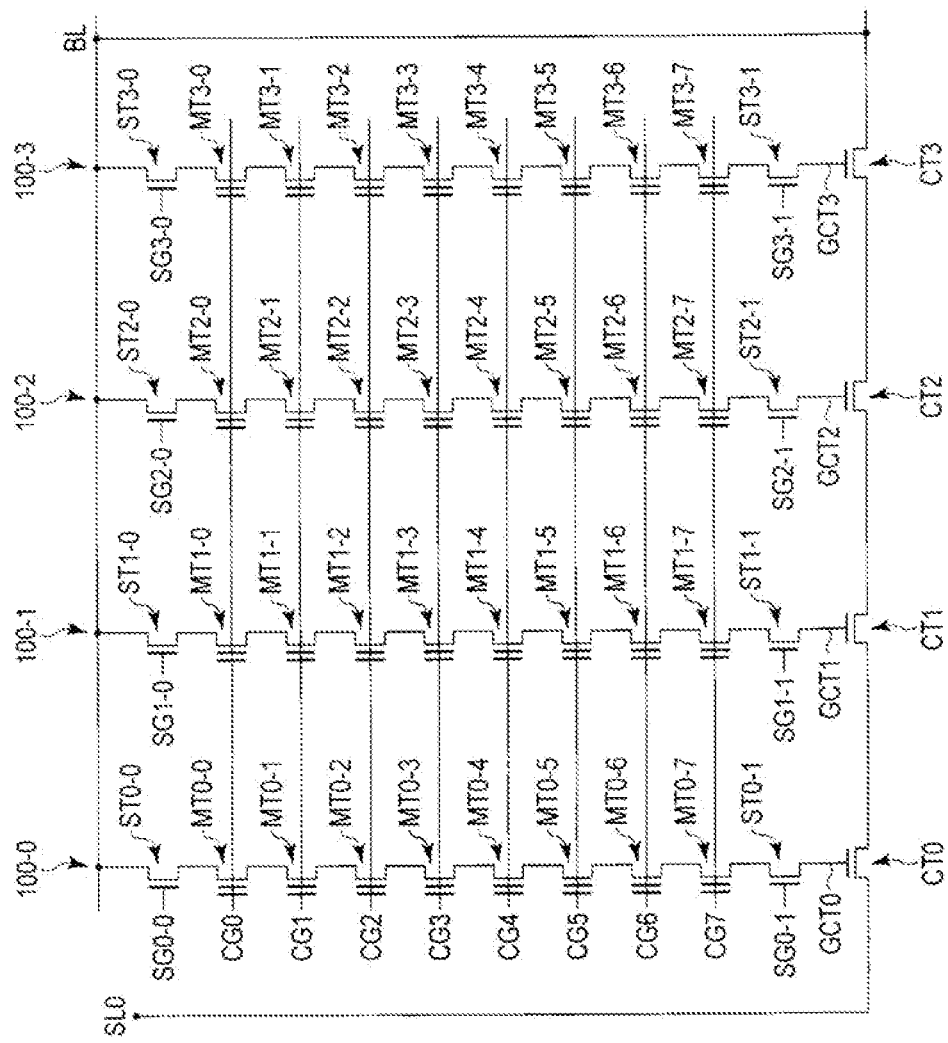
FIG. 14 is a circuit diagram illustrating a modified example of the memory cell array according to the embodiment.

As illustrated in FIG. 14, each of the memory strings 100_0 to 100_3 may include two select transistors. That is, the memory string 100_0 includes a select transistor ST0_1 having a select gate SG0_1 formed at the lowermost layer as the gate, and a select transistor ST0_0 having a select gate SG0_0 formed at the uppermost layer as the gate. In the same manner, the memory string 100_1 includes a select transistor ST1_1 (select gate SG1_1) and a select transistor ST1_0 (select gate SG1_0), the memory string 100_2 includes a select transistor ST2_1 (select gate SG2_1) and a select transistor ST2_0 (select gate SG2_0), and the memory string 100_3 includes a select transistor ST3_1 (select gate SG3_1) and a select transistor ST3_0 (select gate SG3_0).

In addition, each of the memory strings 100_0 to 100_3 may include only the select transistor formed at the lowermost layer, or may include a select transistor at any position in the string. In other words, the position of the select transistor formed in each of the memory strings 100_0 to 100_3 is not limited to the lowermost layer and the uppermost layer.

Each of the embodiments may have the following operations and configurations.

(1) In a multi-level read operation, when the threshold voltage is at an A level, a B level, and a C level in ascending order of level, a voltage applied to a word line selected in the A-level read operation is, for example, in a range between 0 V and 0.55 V. Without being limited thereto, the voltage may be in any of ranges between 0.1 V and 0.24 V, between 0.21 V and 0.31 V, between 0.31 V and 0.4 V, between 0.4 V and 0.5 V, and between 0.5 V and 0.55 V.

A voltage applied to a word line selected in the read operation at the B level is, for example, in a range between 1.5 V and 2.3 V. Without being limited thereto, the voltage may be in any of ranges between 1.75 V and 1.8 V, between 1.8 V and 1.95 V, between 1.95 V and 2.1 V, and between 2.1 V and 2.3 V.

A voltage applied to a word line selected in the read operation at the C level is, for example, in a range between 3.0 V and 4.0 V. Without being limited thereto, the voltage may be in any of ranges between 3.0 V and 3.2 V, between 3.2 V and 3.4 V, between 3.4 V and 3.5 V, between 3.5 V and 3.7 V, and between 3.7 V and 4.0 V.

A time (tR) for the read operation may be, for example, in any of ranges between 25 μs and 38 μs, between 38 μs and 70 μs, and between 70 μs and 80 μs.

(2) The write operation includes a program operation and a verify operation. In the write operation, a voltage that is initially applied to a word line selected during the program operation is, for example, in a range between 13.7 V and 14.3 V. Without being limited thereto, the voltage may be, for example, in any of ranges between 13.7 V and 14.0 V and between 14.0 V and 14.7 V.

A voltage that is initially applied to a word line selected when an odd-numbered word line is written, and a voltage that is initially applied to a word line selected when an even-numbered word line is written may be changed.

When the program operation is in an incremental step pulse program (ISPP) type, a step-up voltage is, for example, about 0.5 V.

A voltage applied to a non-selected word line may be, for example, in a range between 7.0 V and 7.3 V. Without being limited thereto, the voltage may be, for example, in a range between 7.3 V and 8.4 V or may be equal to or less than 7.0 V.

A pass voltage applied may be changed according to whether the non-selected word line is an odd-numbered word line or an even-numbered word line.

A time (tProg) for the write operation may be, for example, in any of ranges between 1,700 μs and 1,800 μs, between 1,800 μs and 1,900 μs, and between 1,900 μs and 2,000 μs.

(3) In the erase operation, a voltage that is initially applied to a well which is formed in the upper portion of the semiconductor substrate and has a memory cell disposed on the upper side is, for example, in a range between 12 V and 13.7 V. Without being limited thereto, the voltage may be, for example, in any of ranges between 13.7 V and 14.8 V, between 14.8 V and 19.0 V, between 19.0 V and 19.8 V, and between 19.8 V and 21 V.

A time (tErase) for the erase operation may be, for example, in any of ranges between 3,000 μs and 4,000 μs, 4,000 μs and 5,000 μs, and between 4,000 μs and 9,000 μs.

(4) The memory cell includes a charge storage layer disposed on the semiconductor substrate (silicon substrate) via a tunnel insulating film having a film thickness of 4 to 10 nm. The charge storage layer may be a stacked structure including an insulating film which has a film thickness of 2 to 3 nm and is made of SiN, SiON, or the like and polysilicon having a film thickness of 3 to 8 nm. In addition, a metal such as Ru may be added to the polysilicon. An insulating film is formed on the charge storage layer. The insulating film includes a silicon oxide film having a film thickness of 4 to 10 nm, which is interposed between a High-k film as a lower layer having a film thickness of 3 to 10 nm and a High-k film as an upper layer having a film thickness of 3 to 10 nm. As the High-k film, HfO or the like may be employed. In addition, the film thickness of the silicon oxide film may be greater than the film thickness of the High-k film. A control electrode having a film thickness of 30 nm to 70 nm may be formed on the insulating film via a material which has a film thickness of 3 to 10 nm for adjusting a work function. Here, the material for adjusting a work function is a metal oxide film such as TaO or a metal nitride film such as TaN. As the control electrode, W or the like may be used.

Moreover, an air gap may be formed between the memory cells.

Hereinafter, the features of the nonvolatile semiconductor memory device according to this embodiment will be described.

A nonvolatile semiconductor memory device according to a first embodiment includes: a semiconductor substrate; a plurality of control gates and a first select gate which are stacked above the semiconductor substrate; a first insulating layer which is formed on a side surface and a bottom surface of a first memory hole which penetrates through the plurality of control gates and the first select gate and reaches the semiconductor substrate; a first semiconductor pillar formed on the first insulating layer; a plurality of first memory cell transistors which include the first semiconductor pillar, the first insulating layer formed on the side surface of the first memory hole, and the plurality of control gates and are connected in series; a first select transistor which includes the first semiconductor pillar, the first insulating layer formed on the side surface of the first memory hole, and the first select gate and is connected to the plurality of first memory cell transistors in series; a first memory string including the plurality of first memory cell transistors and the first select transistor; a bit line electrically connected to one end of the first memory string; a first transistor which includes the semiconductor substrate, the first insulating layer formed on the bottom surface of the first memory hole, and the first semiconductor pillar and in which a gate is electrically connected to the other end of the first memory string and one end is connected to the bit line; and a source line electrically connected to the other and of the first transistor.

A nonvolatile semiconductor memory device according to a second embodiment is the nonvolatile semiconductor memory device according to the first embodiment and further includes: a second select gate which is stacked above the semiconductor substrate and is adjacent to the first select gate; a second insulating layer which is formed on a side surface and a bottom surface of a second memory hole which penetrates through the plurality of control gates and the second select gate, reaches the semiconductor substrate, and is adjacent to the first memory hole; a second semiconductor pillar formed on the second insulating layer; a plurality of second memory cell transistors which include the second semiconductor pillar, the second insulating layer formed on the side surface of the second memory hole, and the plurality of control gates and are connected in series; a second select transistor which includes the second semiconductor pillar, the second insulating layer formed on the side surface of the second memory hole, and the second select gate and is connected to the plurality of second memory cell transistors in series; a second memory string which includes the plurality of second memory cell transistors and the second select transistor and of which one end is electrically connected to the bit line; and a second transistor which includes the semiconductor substrate, the second insulating layer formed on the bottom surface of the second memory hole, and the second semiconductor pillar and in which a gate is electrically connected to the other end of the second memory string, one end is connected to one end of the first transistor, and the other end is electrically connected to the bit line.

A nonvolatile semiconductor memory device according to a third embodiment is the nonvolatile semiconductor memory device according to the second embodiment and further includes a control circuit which applies a first voltage to the bit line during a read operation and applies a second voltage that is equal to or higher than the first voltage to the first select gate and the second select gate.

A nonvolatile semiconductor memory device according to a fourth embodiment is the nonvolatile semiconductor memory device according to the third embodiment, in which the control circuit allows the source line to float.

A nonvolatile semiconductor memory device according to a fifth embodiment is the nonvolatile semiconductor memory device according to the second embodiment and further includes a control circuit which applies a first voltage to the bit line during a read operation, applies a second voltage that is equal to or higher than the first voltage to the first select gate, and applies a third voltage that is lower than the first voltage to the second select gate.

A nonvolatile semiconductor memory device according to a sixth embodiment is the nonvolatile semiconductor memory device according to the fifth embodiment, in which the control circuit sets the source line to 0 V.

A nonvolatile semiconductor memory device according to a seventh embodiment includes: a first memory string including a plurality of first memory cell transistors and a first select transistor which are connected in series; a second memory string including a plurality of second memory cell transistors and a second select transistor which are connected in series; a bit line which is electrically connected to one end of the first memory string and one end of the second memory string; a first transistor of which a gate is connected to the other end of the first memory string; a source line which is electrically connected to one end of the first transistor; and a second transistor of which a gate is connected to the other end of the second memory string, one end is electrically connected to the other end of the first transistor, and the other end is electrically connected to the bit line.

A nonvolatile semiconductor memory device according to an eighth embodiment is the nonvolatile semiconductor memory device according to seventh embodiment and further includes a control circuit which applies a first voltage to the bit line during a read operation and applies a second voltage that is equal to or higher than the first voltage to a gate of the first select transistor and a gate of the second select transistor.

A nonvolatile semiconductor memory device according to a ninth embodiment is the nonvolatile semiconductor memory device according to the eighth embodiment, in which the control circuit allows the source line to float.

A nonvolatile semiconductor memory device according to a tenth embodiment is the nonvolatile semiconductor memory device according to the seventh embodiment and further includes a control circuit which applies a first voltage to the bit line during a read operation, applies a second voltage that is equal to or higher than the first voltage to a gate of the first select transistor, and applies a third voltage that is lower than the first voltage to a gate of the second select transistor.

A nonvolatile semiconductor memory device according to an eleventh embodiment is the nonvolatile semiconductor memory device according to the tenth embodiment, in which the control circuit sets the source line to 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a first memory string including a plurality of first memory cell transistors and a first select transistor that are connected in series;
    a second memory string including a plurality of second memory cell transistors and a second select transistor that are connected in series;
    a bit line that is electrically connected to a first end of the first memory string and a first end of the second memory string;
    a first transistor having a gate that is connected to a second end of the first memory string;
    a source line that is electrically connected to a first end of the first transistor; and
    a second transistor having a gate that is connected to a second end of the second memory string, a first end that is electrically connected to a second end of the first transistor, and a second end that is electrically connected to the bit line.

2. The device according to claim 1, further comprising:
    a control circuit that applies during a first time period of a read operation, a first voltage to the bit line, a second voltage that is equal to or higher than the first voltage to a gate of the first select transistor and a gate of the second select transistor, and a first read voltage to gates of selected and non-selected memory cell transistors.

3. The device according to claim 2, wherein
    the source line is in a floating state during the first time period of the read operation.

4. The device according to claim 3, wherein
    the control circuit applies during a second time period of the read operation following the first time period, the first voltage to the bit line, the second voltage to the gate of the first select transistor, a third voltage that is lower than the first voltage to the gate of the second select transistor, the first read voltage to the gates of the non-selected memory cell transistor, and a second read voltage lower than the first read voltage to the gate of the selected memory cell transistor.

5. The device according to claim 4, wherein
    the source line is set to be 0 V during a third time period of the read operation following the second time period.

6. The device according to claim 5, further comprising:
a sense amplifier that senses during the third time period of the read operation, a change in the voltage of the bit line to determine data stored in the selected memory cell transistor.

7. The device according to claim 6, wherein
the sense amplifier determines that the data stored in the selected memory cell transistor is a first value if the change in the voltage of the bit line is sensed and a second value if the change in the voltage of the bit line is not sensed.

8. The device according to claim 1, further comprising:
additional memory strings and additional transistors, each having a gate that is connected to a second end of one of the additional memory strings, wherein
current paths of the first transistor, the additional transistors, and the second transistor are connected in series between the source line and the bit line.

9. A nonvolatile semiconductor memory device comprising:
a first memory string including a plurality of first memory cell transistors and a first select transistor that are connected in series;
a second memory string including a plurality of second memory cell transistors and a second select transistor that are connected in series;
a bit line that is electrically connected to a first end of the first memory string and a first end of the second memory string;
a first transistor having a gate that is connected to a second end of the first memory string;
a source line that is electrically connected to a first end of the first transistor;
a second transistor having a gate that is connected to a second end of the second memory string, a first end that is electrically connected to a second end of the first transistor, and a second end that is electrically connected to the bit line; and
a control circuit configured to apply voltages to gates of the first and second select transistors, gates of the memory cell transistors, and to the bit line, so that the first and second transistors are not turned on during a write operation.

10. The device according to claim 9, wherein
the control circuit during a first time period of the write operation, applies a first voltage to the gates of the first and second select transistors and the gates of the memory cell transistors to turn on the first and second select transistors and the memory cell transistors and a zero voltage to the bit line.

11. The device according to claim 10, wherein
the control circuit during a second time period of the write operation following the first time period, applies the first voltage to the gate of the first select transistor to keep the first select transistor in an ON state and a second voltage to the second select transistor to turn off the second select transistor.

12. The device according to claim 11, wherein
the control circuit during the second time period of the write operation, applies a third voltage to the bit line and a program voltage to a gate of a selected memory cell transistor, as a result of which data is written into the selected memory cell transistor.

13. The device according to claim 12, further comprising:
a sense amplifier connected to the bit line and configured to temporarily hold the data to be written into the selected cell transistor.

14. The device according to claim 9, further comprising:
additional memory strings and additional transistors, each having a gate that is connected to a second end of one of the additional memory strings, wherein
current paths of the first transistor, the additional transistors, and the second transistor are connected in series between the source line and the bit line.

15. A nonvolatile semiconductor memory device comprising:
a first memory string including a plurality of first memory cell transistors and a first select transistor that are connected in series;
a second memory string including a plurality of second memory cell transistors and a second select transistor that are connected in series;
a bit line that is electrically connected to a first end of the first memory string and a first end of the second memory string;
a first transistor having a gate that is connected to a second end of the first memory string;
a source line that is electrically connected to a first end of the first transistor;
a second transistor having a gate that is connected to a second end of the second memory string, a first end that is electrically connected to a second end of the first transistor, and a second end that is electrically connected to the bit line; and
a control circuit configured to apply voltages to gates of the first and second select transistors and to the bit line during an erase operation.

16. The device according to claim 15, wherein
the control circuit during the erase operation, applies a first voltage to the gates of the first and second select transistors and a second voltage that is greater than the first voltage to bit line.

17. The device according to claim 16, wherein the first voltage applied to the gates of the first and second select transistors causes a gate-induced drain leakage in source regions of the first and second select transistors.

18. The device according to claim 17, wherein
the control circuit during the erase operation, applies a zero voltage to the gates of the memory cell transistors.

19. The device according to claim 18, wherein
during the erase operation, the source line is in a floating state.

20. The device according to claim 15, further comprising:
additional memory strings and additional transistors, each having a gate that is connected to a second end of one of the additional memory strings, wherein
current paths of the first transistor, the additional transistors, and the second transistor are connected in series between the source line and the bit line.

* * * * *